(12) United States Patent
Chauhan et al.

(10) Patent No.: US 10,601,408 B2
(45) Date of Patent: Mar. 24, 2020

(54) LOW FREQUENCY OSCILLATOR WITH ULTRA-LOW SHORT CIRCUIT CURRENT

(71) Applicant: Texas Instruments Incorporated, Dallas, TX (US)

(72) Inventors: Rajat Chauhan, Bangalore (IN); Vipul Kumar Singhal, Bangalore (IN); Vinod Joseph Menezes, Bangalore (IN); Mahesh Madhukar Mehendale, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/952,549

(22) Filed: Apr. 13, 2018

(65) Prior Publication Data
US 2019/0319614 A1      Oct. 17, 2019

(51) Int. Cl.
| H03K 4/12 | (2006.01) |
| H03K 4/50 | (2006.01) |
| H03K 4/08 | (2006.01) |
| H03K 4/48 | (2006.01) |

(52) U.S. Cl.
CPC .............. *H03K 4/085* (2013.01); *H03K 4/12* (2013.01); *H03K 4/48* (2013.01); *H03K 4/50* (2013.01)

(58) Field of Classification Search
CPC .... H03K 3/0231; H03K 3/02315; H03K 3/03; H03K 3/0307; H03K 3/354; H03K 3/3545; H03K 4/08; H03K 4/085; H03K 4/12; H03K 4/48; H03K 4/50; H03K 4/501; H03K 4/502

USPC ................................ 331/111, 143, 150, 153
See application file for complete search history.

(56) References Cited

U.S. PATENT DOCUMENTS

| 4,301,427 | A | * | 11/1981 | Suzuki | ................... | H03K 4/501 |
| | | | | | | 331/111 |
| 4,365,212 | A | * | 12/1982 | Gentile | ................ | H03K 3/0231 |
| | | | | | | 331/111 |
| 4,380,746 | A | * | 4/1983 | Sun | ......................... | H03K 7/06 |
| | | | | | | 307/108 |
| 4,535,305 | A | * | 8/1985 | Matsuo | .................. | H03K 3/011 |
| | | | | | | 327/182 |
| 4,623,851 | A | * | 11/1986 | Abou | .................. | H03K 3/0231 |
| | | | | | | 331/111 |
| 4,785,262 | A | * | 11/1988 | Ryu | ...................... | H03K 3/011 |
| | | | | | | 327/114 |
| 4,922,141 | A | * | 5/1990 | Lofgren | .................... | H03H 9/38 |
| | | | | | | 327/158 |

(Continued)

OTHER PUBLICATIONS

Xiaodan Zou et al, "A 1-V 450-nW Fully Integrated Programmable Biomedical Sensor Interface Chip", IEEE Journal of Solid-State Circuits, vol. 44, No. 4, Apr. 2009, pp. 1067-1077.

(Continued)

*Primary Examiner* — Levi Gannon
(74) *Attorney, Agent, or Firm* — Michael A. Davis, Jr.; Charles A. Brill; Frank D. Cimino

(57) ABSTRACT

In described examples, a sawtooth waveform generator generates a sawtooth waveform having a first rise time. A comb waveform circuit has a power terminal coupled to receive the sawtooth waveform from an output of the sawtooth waveform generator. The comb waveform circuit generates a comb waveform in response to the sawtooth waveform. The comb waveform has a second rise time that is faster than the first rise time.

16 Claims, 14 Drawing Sheets

(56) References Cited

U.S. PATENT DOCUMENTS

| | | | | |
|---|---|---|---|---|
| 5,592,128 A * | 1/1997 | Hwang | ............... | G05F 1/613 323/288 |
| 5,670,915 A * | 9/1997 | Cooper | ............... | H03K 3/0231 331/111 |
| 6,163,190 A * | 12/2000 | Takai | ............... | H03K 3/012 327/131 |
| 2013/0038364 A1 * | 2/2013 | Tokairin | ............... | H03K 4/502 327/156 |
| 2013/0082789 A1 * | 4/2013 | Inoue | ............... | H03K 3/36 331/111 |

OTHER PUBLICATIONS

"MSP430x43x1, MSP430x43x, MSP430x44x1, MSP430x44x Mixed Signal Microcontroller", SLAS344G, Texas Instruments, Inc., Jan. 2002, Revised Oct. 2009, pp. 1-10.

"TLP5000 Nano-Power Programmable Timer with Watchdog Functionality", TLP5000, SNAS626B, Texas Instruments, Inc., Jul. 2013, Revised Dec. 2014, pp. 1-21.

Tzu-Ming Wang, Ming-Dou Ker, and Hung-Tai Liao, "Design of Mixed-Voltage-Tolerant Crystal Oscillator Circuit in Low-Voltage CMOS Technology", IEEE Transactions on Circuits and Systems—I:Regular Papers, vol. 56, No. 5, May 2009, pp. 966-974.

Dongmin Yooon et al, "A 5.58 nW Crystal Oscillator Using Pulsed Driver for Real-Time Clocks", IEEE Journal of Solid-State Circuits, vol. 51, No. 2, Feb. 2016, pp. 509-522.

Keng-Jan Hsiao, "A 1.89nW/0.15V Self-Charged XO for Real-Time Clock Generation", 2014 IEEE International Solid-State Circuits Conference, Session 17, Analog Techniques 17.7, Feb. 11, 2014, pp. 298-299.

Aatmesh Shrivastava, Divya Akella Kamakshi, and Benton H. Calhoun, "A1.5 nW, 32.768 kHz XTAL Oscillator Operational From a 0.3 V Supply", IEEE Journal of Solid-State Circuits, vol. 51, No. 3, Mar. 2016, pp. 686-696.

Danielle Griffith et al, A 190nW 33kHz RC Oscillator with +-0.21% Temperature Stability and 4ppm Long-Term 2014 IEEE International Solid-State Circuits Conference, Session 17, Analog Techniques 17.8, Feb. 11, 2014, pp. 300-302.

Arun Paidimarri et al, "An RC Oscillator With Comparator Offset Cancellation", IEEE Journal of Solid-State Circuits, vol. 51, No. 8, Aug. 2016, pp. 1866-1877.

Urs Denier, "Analysis and Design of an Ultralow-Power CMOS Relaxation Oscillator", IEEE Transactions on Circuits and Systems—I:Regular Papers, vol. 57, No. 8, Aug. 2010, pp. 1973-1982.

Takashi Tokairin et al, "A 280nW, 100kHz, 1-Cycle Start-up Time, On-chip CMOS Relaxation Oscillator Employing a Feedforward Period Control Scheme", 2012 Symposium on VLSI Circuits (VLSIC), Jun. 2012, pp. 16-17.

Seokhyeon Jeong et al, "A 5.8 nW CMOS Wake-Up Timer for Ultra-Low-Power Wireless Applications", IEEE Journal of Solid-State Circuits, vol. 50, No. 8, Aug. 2015, pp. 1754-1763.

Vadim Ivanov, Ralf Brederlow, and Johannes Gerber, "An Ultra Low Power Bandgap Operational at Supply From 0.75 V", IEEE Journal of Solid-State Circuits, vol. 47, No. 7, Jul. 2012, pp. 1515-1523.

Phillip M. Nadeau, Arun Paidimarri, and Anantha P. Chandrakasan, "Ultra Low-Energy Relaxation Oscillator With 230 fJ/cycle Efficiency", IEEE Journal of Solid-State Circuits, vol. 51, No. 4, Apr. 2016, pp. 789-799.

Yen-Po Chen et al, "A 2.98nW Bandgap Voltage Reference Using a Self-Tuning Low Leakage Sample and Hold", 2012 Symposium on VLSI Circuits Digest of Technical Papers, pp. 200-201.

Yu-Shiang Lin, Dennis Sylvester, and David Blaauw, "A sub-pW timer using gate leakage for ultra low-power sub-Hz monitoring systems", IEEE 2007 Custom Integrated Circuits Conference, Sep. 16-19, 2007, San Jose, CA, pp. 397-400.

Yoonmyung Lee et al, "A 660pW Multi-Stage Temperature-Compensated Timer for Ultra-Low-Power Wireless Sensor Node Synchronization", 2011 IEEE International Solid-State Circuits Conference, Feb. 21, 2011,pp. 46-48.

Yu-Shiang Lin, Dennis M. Sylvester, and David T. Blaauw, "A 150pW Program-and-Hold Timer for Ultra-Low-Power Sensor Platforms", 2009 IEEE International Solid-State Circuits Conference—Digest of Technical Papers, Feb. 2009, San Francisco, CA, pp. 326-327, 327a.

Aatmesh Shrivastrave and Benton H. Calhoun, "A 150nW, 5ppm/oC, 100khz On-Chip Clock Source for Ultra Low Power SoCs", Proceedings of the IEEE 2012 Custom Integrated Circuits Conference, Sep. 2012, pp. 1-4.

Luiz Alberto Pasini Melek, IEEE Transactions on Circuit and Systems—I:Regular Papers, vol. 64, No. 4, Apr. 2017, p. 869-878.

Yoonmyung Lee et al, "A Sub-nW Multi-stage Temperature Compensated Timer for Ultra-Low-Power Sensor Nodes", IEEE Journal of Solid-State Circuits, vol. 48, No. 10, Oct. 2013, pp. 2511-2521.

* cited by examiner

US 10,601,408 B2

LOW FREQUENCY OSCILLATOR WITH ULTRA-LOW SHORT CIRCUIT CURRENT

TECHNICAL FIELD

This relates to low power oscillator circuits.

BACKGROUND

As the "internet of things" (IoT) becomes more widespread, small portable or autonomous devices are being powered by micro-batteries or energy harvesting systems. In such devices, minimal power consumption is important. In many such devices, an oscillator operating at a low frequency may be used. In many cases, the low frequency oscillator does not need to have good accuracy.

SUMMARY

In described examples, a sawtooth waveform generator generates a sawtooth waveform having a first rise time. A comb waveform circuit has a power terminal coupled to receive the sawtooth waveform from an output of the sawtooth waveform generator. The comb waveform circuit generates a comb waveform in response to the sawtooth waveform. The comb waveform has a second rise time that is faster than the first rise time.

DETAILED DESCRIPTION OF EXAMPLE EMBODIMENTS

Figure 1:
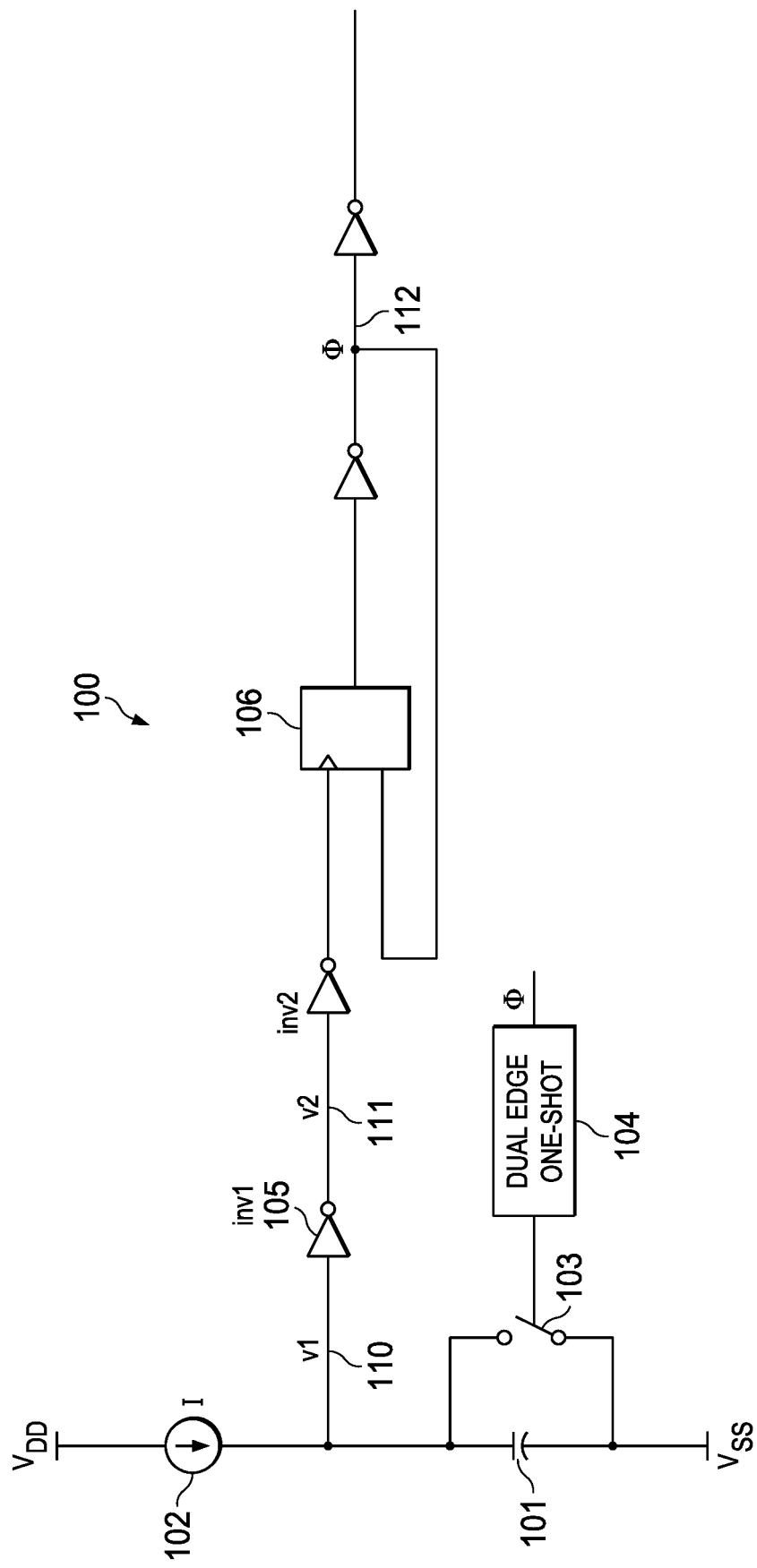
FIG. 1 is a block diagram of a conventional kHz oscillator.

In the drawings, like elements are denoted by like reference numerals for consistency.

Small, low power devices are useful for a wide range of applications, such as: residential and industrial sensors, medical implants, smart cards, IoT nodes, and other applications. For such applications, a low "standby" or "quiescent current" (Iq) is desirable. To achieve an Iq that is only a few nano-amperes (nA), a S/H technique (sample and hold) running on a very low frequency clock may provide good results. For example, an oscillator that generates a low frequency clock signal may be operated in the sub 10 Khz range.

For many applications, an oscillator generating a low frequency clock does not need to have good accuracy, but needs to have very low current consumption, because the oscillator must operate continuously and therefor contributes to Iq.

A relaxation oscillator is a conventional low frequency oscillator architecture. A relaxation oscillator is a nonlinear electronic oscillator circuit that generates a non-sinusoidal repetitive output signal, such as a triangle wave or square wave. The circuit may include a feedback loop containing a device that repetitively charges a capacitor or inductor through a resistance until it reaches a threshold level, and then discharges it again. Examples of such a device include: (a) a switching device, such as a transistor, comparator, relay or operational amplifier; and (b) a negative resistance device, such as a tunnel diode. The period of the oscillator depends on the time constant of the capacitor or inductor circuit. The switching device switches abruptly between charging and discharging modes, and thus generates a discontinuously changing repetitive waveform, which may be referred to as a sawtooth waveform.

The sawtooth signal has very slow signal transitions, which may result in a large short-circuit current in a digital circuit of the feedback loop that is tracking the sawtooth signal. Such short circuit current may limit ultra-low power operation in a sub 10 kHz oscillator.

Example embodiments include a comb waveform generator circuit to track a sawtooth signal and generate a very fast voltage transition to thereby reduce short circuit current in a following digital buffer. As described in more detail hereinbelow, this comb waveform generator circuit adds zero extra current over a conventional circuit. Instead of directly connecting a sawtooth signal to the input of a CMOS (complementary metal oxide semiconductor) inverter/buffer, the sawtooth signal is converted into a fast edge comb waveform by passing the slow sawtooth waveform through a PMOS (p-type MOS) transistor. By connecting this fast edge waveform to a CMOS inverter input, short-circuit current within the CMOS inverter is greatly reduced. Accordingly, extremely small short-circuit current is achieved by faster edge rates at buffer/inverter inputs.

Figure 2:
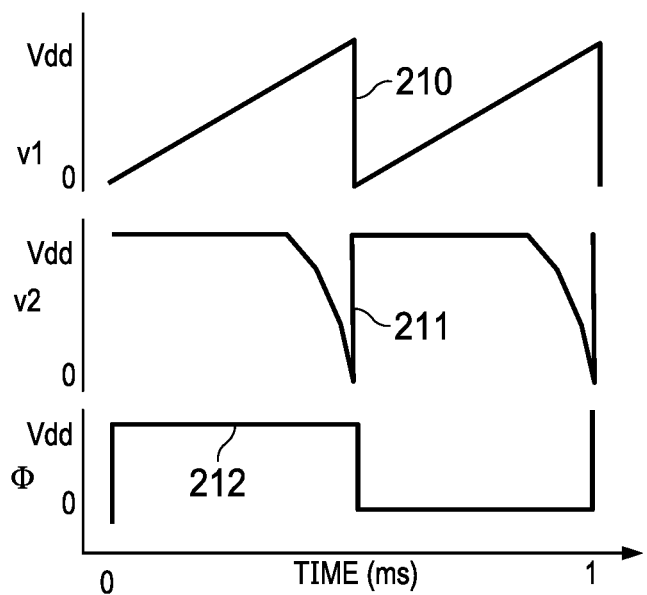
FIG. 2 is a set of waveforms that illustrate operation of the oscillator of FIG. 1.

FIG. 1 is a block diagram of a conventional kHz oscillator. FIG. 2 is a set of waveforms that illustrate operation of the oscillator of FIG. 1. In this description, the term "kHz oscillator" refers to a low frequency oscillator that operates in a range usually below 10 kHz, but some examples may operate at frequencies above 10 kHz.

In this example, a sawtooth waveform is generated by capacitor 101, which is charged by current source 102 and discharged by switch element 103. Switch element 103 is controlled by a dual edge one-shot circuit 104. A CMOS inverter 105 receives the sawtooth signal v1 on signal line 110, which is illustrated by plot 210 of FIG. 2, and generates an output signal v2 on signal line 111, which is illustrated by plot 211 of FIG. 2. Flip-flop 106 toggles in response to each falling edge of sawtooth signal v1 to generate a square wave signal Φ on signal line 112, which is illustrated by plot 212 of FIG. 2. Square wave signal Φ may then be used to initiate each activation of switch device 103.

Assuming oscillator 100 is operating at approximately 1 kHz, the rising transition time of each pulse of sawtooth signal v1 is approximately 0.5 ms. This causes inverter 105 to switch slowly, as indicated by plot 211 in FIG. 2. Such slow switching of a digital device may produce a "short circuit" current while both a pull-up and a pull-down transistor in the output stage of the device are turned on at the same time. Current source 102 may be the only component producing a continuous quiescent current, which may be only a few nano-amps, but the short circuit current may result in an average current consumption of 100 nA or more for oscillator 100.

In another type of low frequency oscillator, a transistor leakage-based technique may be used to reduce current consumption, but that technique is not stable for operation over a wide range of temperatures, such as −40 C to 125 C.

In another type of low frequency oscillator, a slow ramp signal (such as a sawtooth signal) is received as an input by a current biased comparator. This eliminates short-circuit current, but it requires extra bias current and a voltage reference for the comparator. Therefore, Iq usually exceeds 5 nA in such an oscillator.

Figure 3:
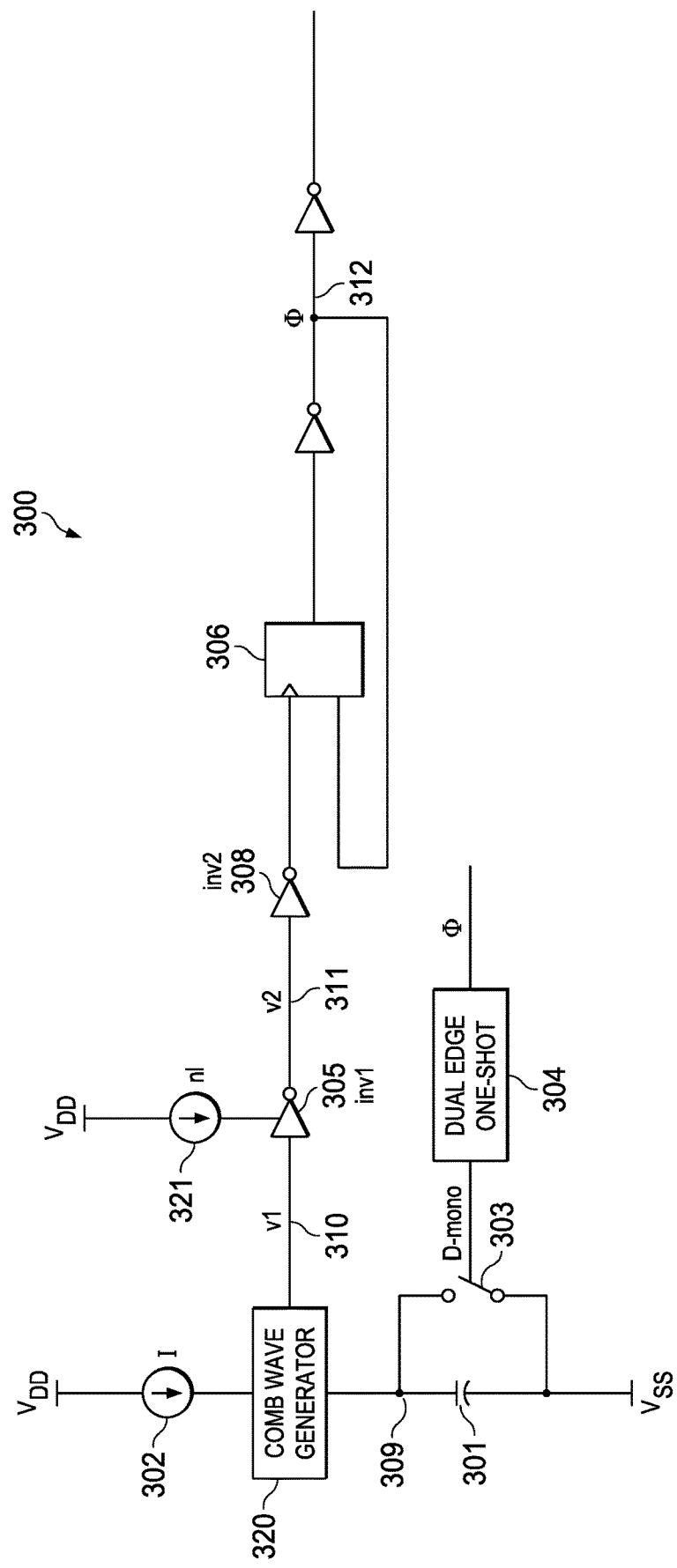
FIG. 3 is a block diagram of a kHz oscillator that includes a comb waveform generator to reduce short circuit current.
Figure 4:
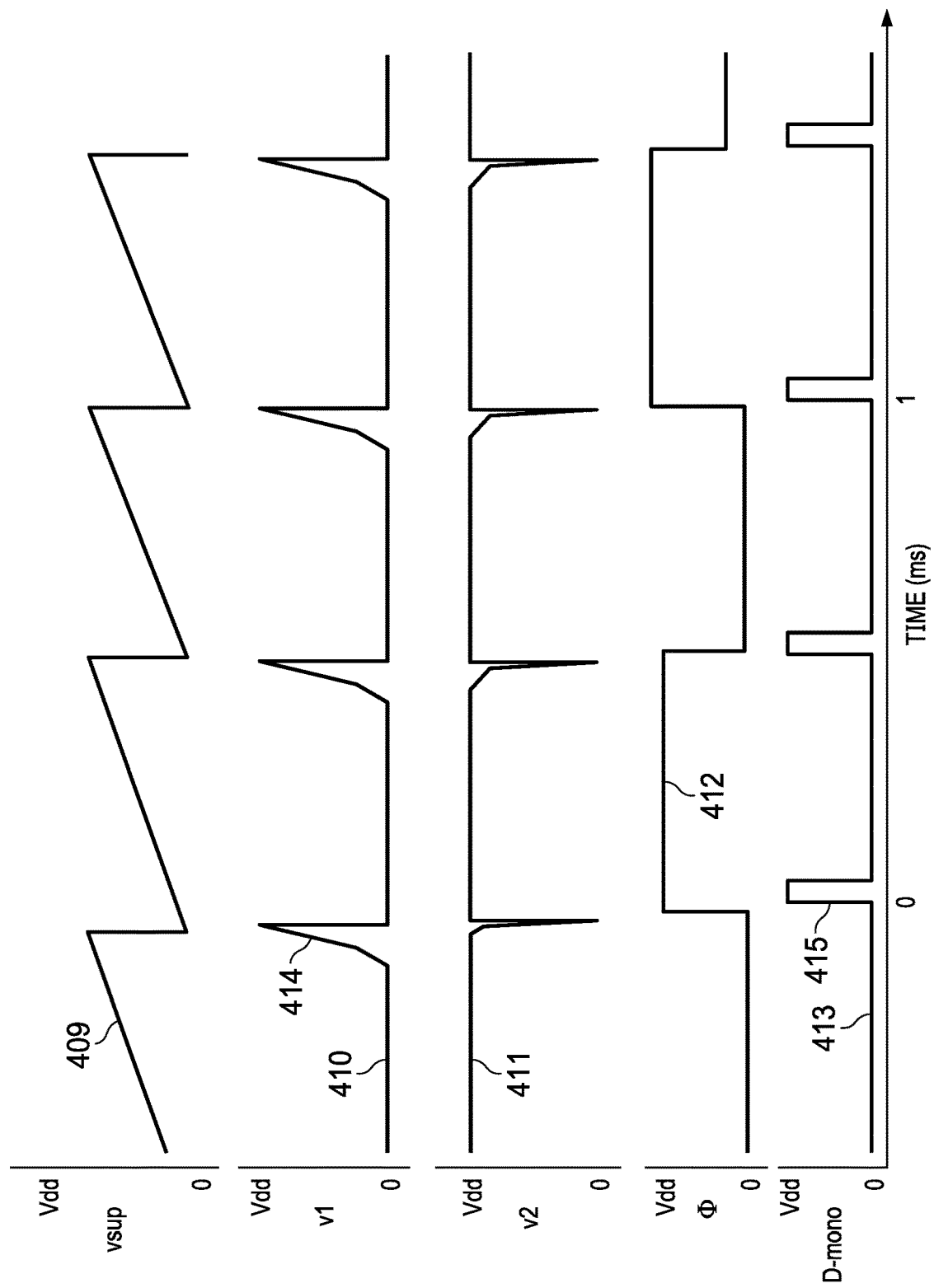
FIG. 4 is a set of waveforms that illustrate operation of the oscillator of FIG. 3

FIG. 3 is a block diagram of a kHz oscillator 300 that includes a comb waveform generator 320 to reduce short circuit current in inverter 305 and inverter 308. FIG. 4 is a set of waveforms that illustrate operation of the oscillator 300. A reduction in short-circuit current may be achieved by configuring inverter 305 to operate in a current-starved mode. This may be done by supplying power to inverter 305 via a current source 321. In this manner, short circuit current may be limited to a maximum value that current source 321 can provide. This configuration makes inverter 305 trip at a point near the NMOS transistor threshold voltage (nch Vt) of an NMOS transistor in the output stage of inverter 305. NMOS transistor 1035 (FIG. 10) is an example. However, with only this improvement, the short circuit current produced in inverters 305 and 308 may remain higher than desired.

As a further improvement, comb waveform generator 320 generates a sharp-edged comb waveform v1 (which may be received as an input by buffer/inverter 305) in response to the slow sawtooth waveform generated by capacitor 301. As illustrated by plot 409 of FIG. 4, comb waveform generator 320 consumes zero extra current (beyond current that is consumed to generate the sawtooth waveform on node 309).

In this example, a sawtooth waveform is generated on node 309 by capacitor 301, which is charged by current source 302 and discharged by switch element 303. Switch element 303 is controlled by a dual edge one-shot circuit 304 (pulse waveform generator), which generates a periodic pulse signal "D-mono" on signal line 313, as illustrated by plot 413 in FIG. 4. Switch element 303 may be a MOS transistor or another type of switching device that can be controlled by one-shot circuit 304. Comb waveform generator 320 receives sawtooth signal from node 309 and, in response thereto, generates a comb waveform v1 on signal line 310. CMOS inverter 305: (a) receives the comb waveform signal v1 on signal line 310, which is illustrated by plot 410 of FIG. 4; and (b) generates an output signal v2 on signal line 311, which is illustrated by plot 411 of FIG. 4. Flip-flop 306 toggles in response to each falling edge of sawtooth signal v1 to generate a square wave signal Φ on signal line 312, which is illustrated by plot 412 of FIG. 4. Square wave signal Φ is then fed back to one-shot circuit 304 for triggering each activation of switch element 303.

As shown in FIG. 4, the rise time of signal v1 illustrated by plot 410 is much faster than the rise time of the sawtooth signal "vsup" illustrated by plot 409. Therefore, inverter 305 of FIG. 3 switches rapidly to generate output signal v2, and short circuit current is significantly reduced (in comparison to a configuration in which a sawtooth signal is received as an input by inverter 305). Similarly, because signal v2 has fast rise and fall times, inverter 308 of FIG. 3 switches rapidly with insignificant short circuit current.

FIG. 3 shows two buffer stages, which are inverter 305 and inverter 308. In another example, these buffers may be implemented in different configurations. For example, two non-inverting buffers may be used. Another example has only a single buffer stage.

In this example, inverter 305 is configured to operate in a current starved mode, using current source 321 to reduce short circuit current. In another example, current source 321 may be omitted, and inverter 305 may be operated in a normal full power mode if short circuit current is low enough, due to fast switching provided by comb waveform generator 320. For example, an average current of 2.7 nA may be drawn by oscillator 300 when inverter 305 is operated in current starved mode. By comparison, an average current of approximately 5 nA may be drawn in an example when inverter 305 is operated in full power mode.

Figure 5:
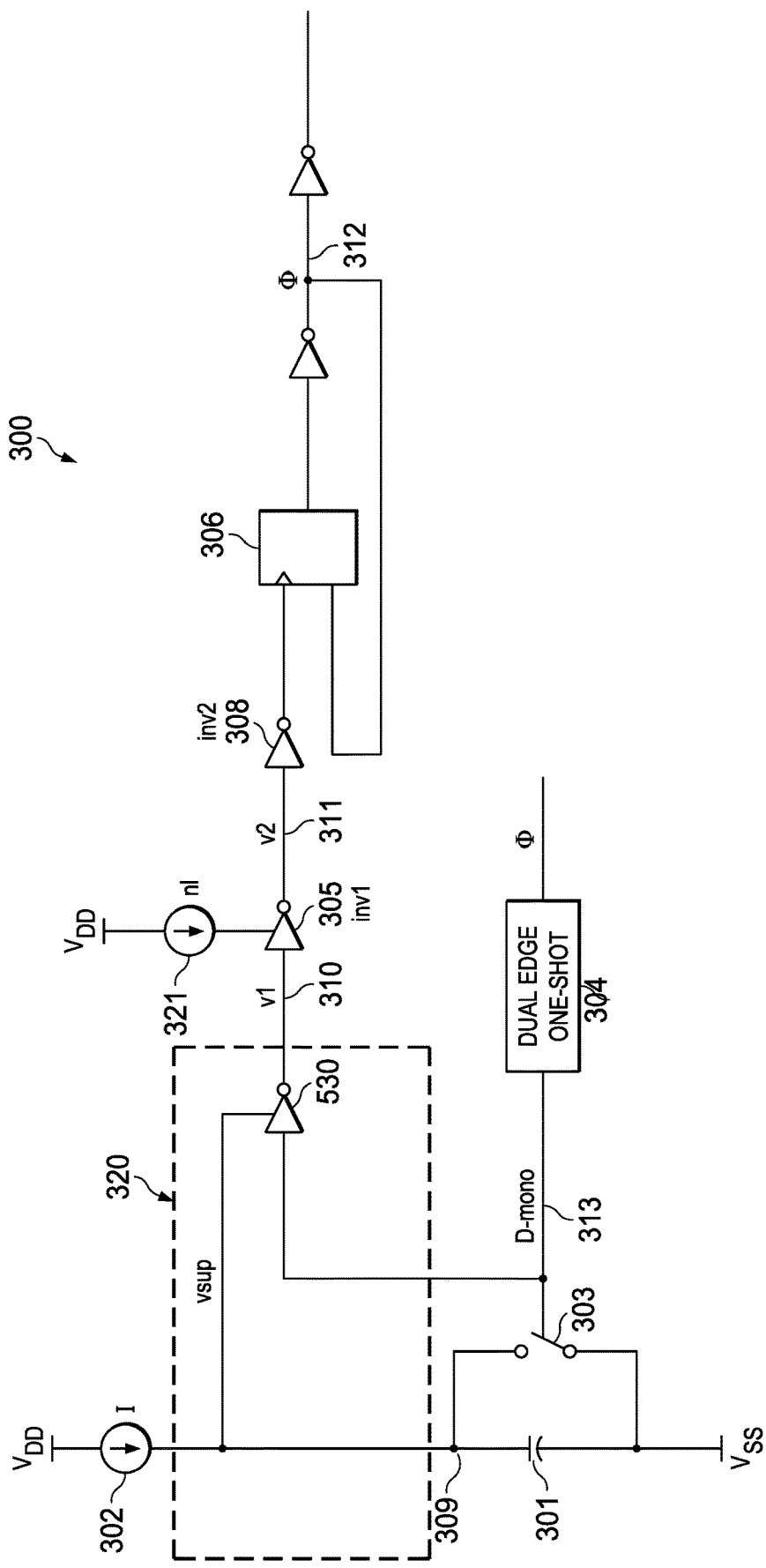
FIG. 5 is a more detailed block diagram of the kHz oscillator of FIG. 3.

FIG. 5 is a more detailed block diagram of the kHz oscillator 300 of FIG. 3. In this example, comb waveform generator 320 includes an inverter 530 that receives one-shot signal D-mono on signal line 313 at an input. The output of inverter 530 generates comb waveform v1 on signal line 310. Inverter 530 receives its supply voltage (vsup) from node 309 in the form of a sawtooth waveform, as illustrated by plot 409 of FIG. 4.

In this example, with a Vdd supply voltage of 1.4V and a charging current for capacitor 301 set at 1.2 nA by current source 302, total average current for oscillator 300 is approximately 2.7 nA.

Figure 6:
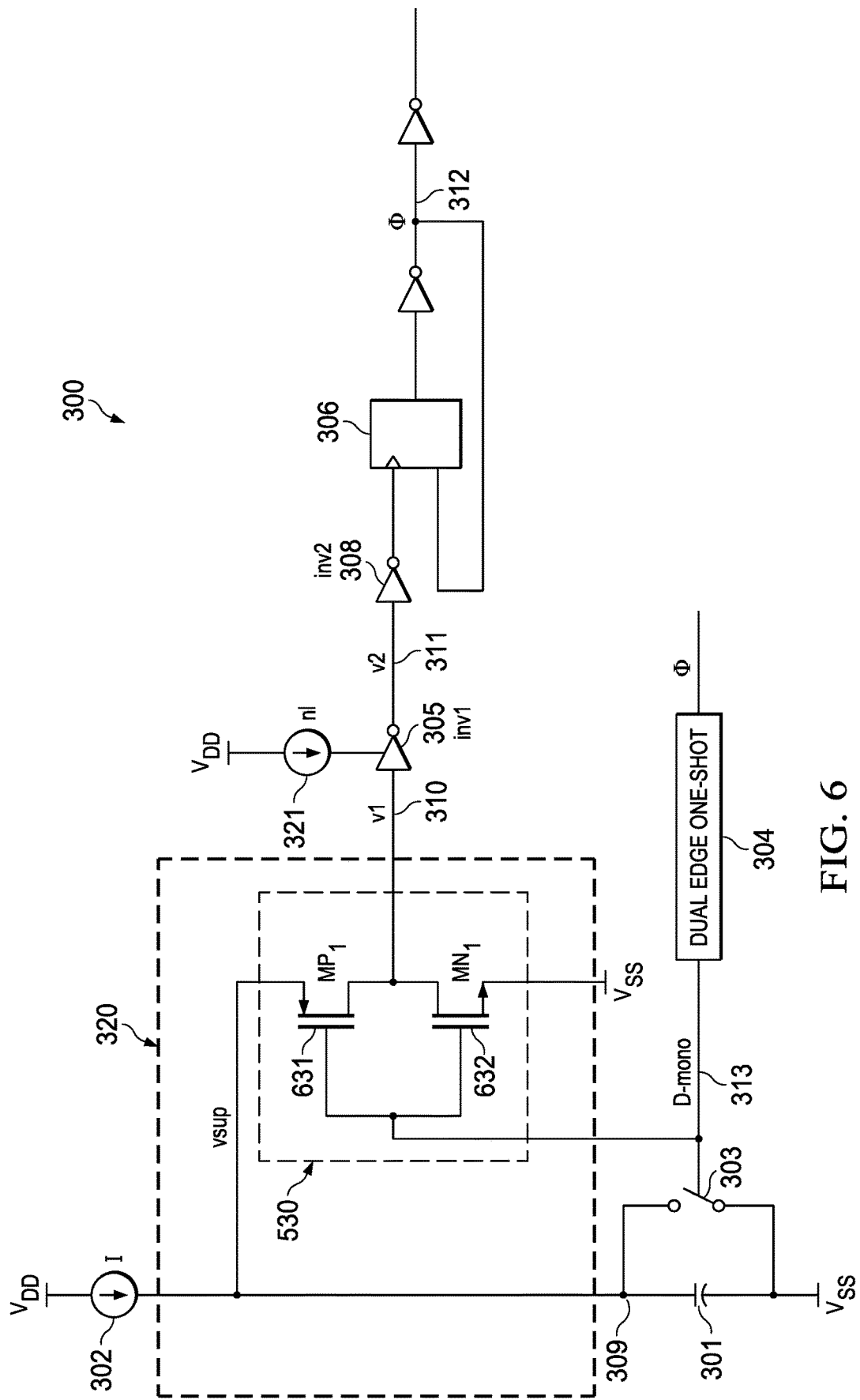
FIG. 6 is a schematic of a comb waveform generator that may be used in FIG. 3.

FIG. 6 is a schematic of comb waveform generator 320 that may be used in FIG. 3. In this example, comb waveform generator 320 includes a p-type MOS (PMOS) transistor 631 and an n-type MOS (NMOS) transistor 632, which are connected in series to implement inverter 530, as shown in FIG. 5. A source terminal of PMOS transistor 631 is connected to signal line 309 and receives the sawtooth waveform vsup. A drain terminal of PMOS transistor 631 is connected to a drain terminal of NMOS transistor 632. A source terminal of NMOS transistor 632 is coupled to supply bus Vss, which is usually connected to ground. A gate input for both MOS transistors 631, 632 is connected to receive the one-shot signal D-mono on signal line 313.

Referring again to FIG. 4, signal D-mono 413 stays low while sawtooth waveform vsup 409 ramps up. This causes NMOS transistor 632 (FIG. 6) to remain off. As sawtooth waveform 409 continues to rise, PMOS transistor 631 of FIG. 6 turns on and rapidly pulls up the output signal v1 on signal line 310 (FIG. 6), as shown by pulse 414 in FIG. 4. This rising edge on signal line 310 (FIG. 6) flows through inverters 305 and 308 (FIG. 6) and triggers flip-flop 306 to toggle, which triggers one-shot circuit 304 (FIG. 6) to generate pulse 415 of FIG. 4. Pulse 415 turns on NMOS transistor 632 (FIG. 6) to pull signal v1 on signal line 310 low. Pulse 415 also turns on switch 303 (FIG. 6), which discharges capacitor 301 (FIG. 6).

Figure 7:
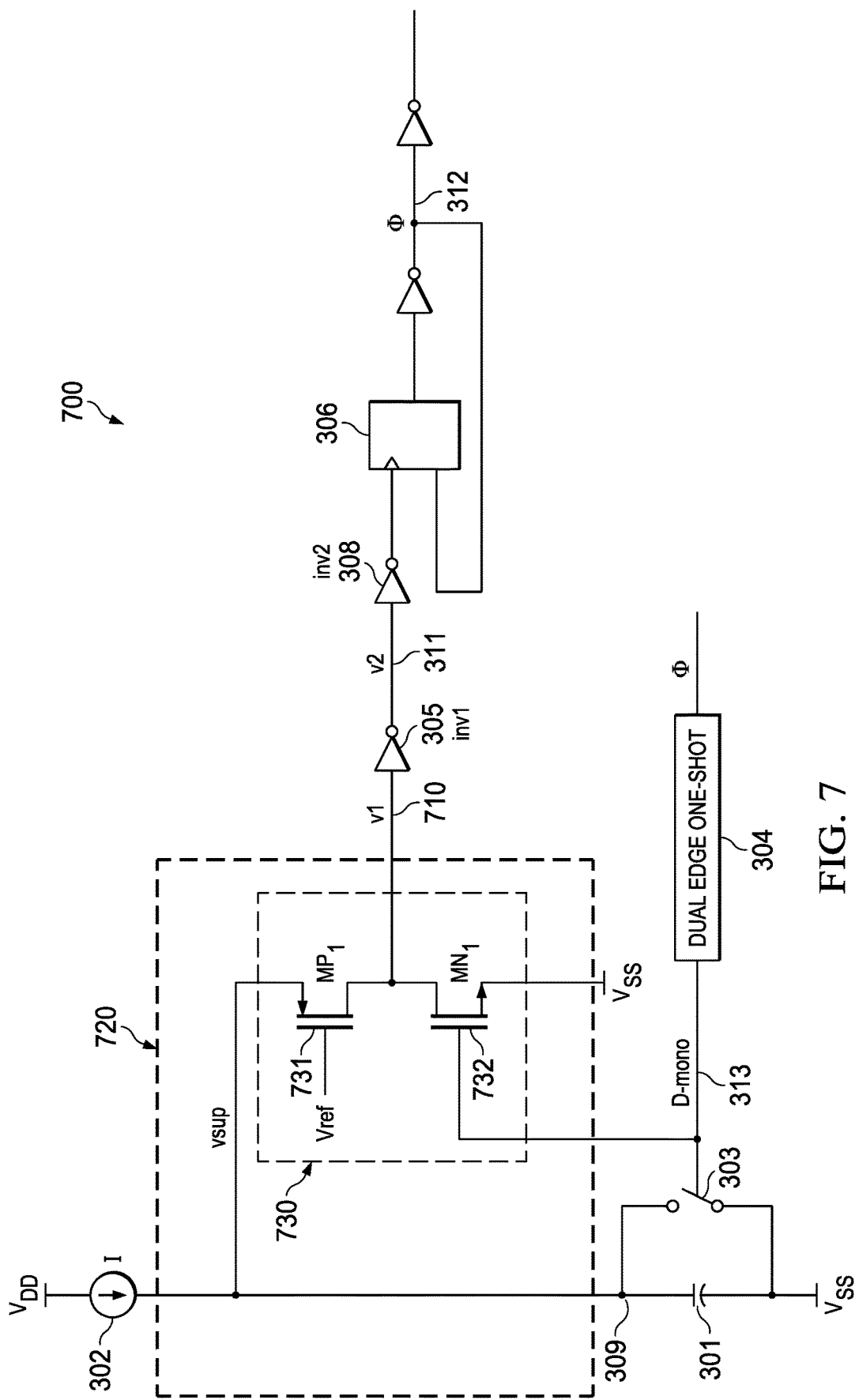
FIG. 7 is a schematic of another comb waveform generator that may be used in FIG. 3.

FIG. 7 is a schematic of another example comb waveform generator 720 that may be used in FIG. 3. In this example, comb waveform generator 720 includes a PMOS transistor 731 and an NMOS transistor 732, which are connected in series to implement inverter 730. Inverter 730 is similar to inverter 530 of FIG. 5, except that a gate input for NMOS transistor 732 is connected to receive the one-shot signal D-mono on signal line 313, while a gate input for PMOS transistor 731 is connected to a reference voltage "Vref". In this example, the vsup on signal line 309 must rise to a value that exceeds Vref before PMOS transistor 731 turns on to pull up signal v1 on output 710. In this manner, reference voltage Vref sets a peak voltage height of comb waveform v1 on signal line 710. As Vref becomes higher, the peak of signal v1 becomes higher on signal line 710.

Figure 8:
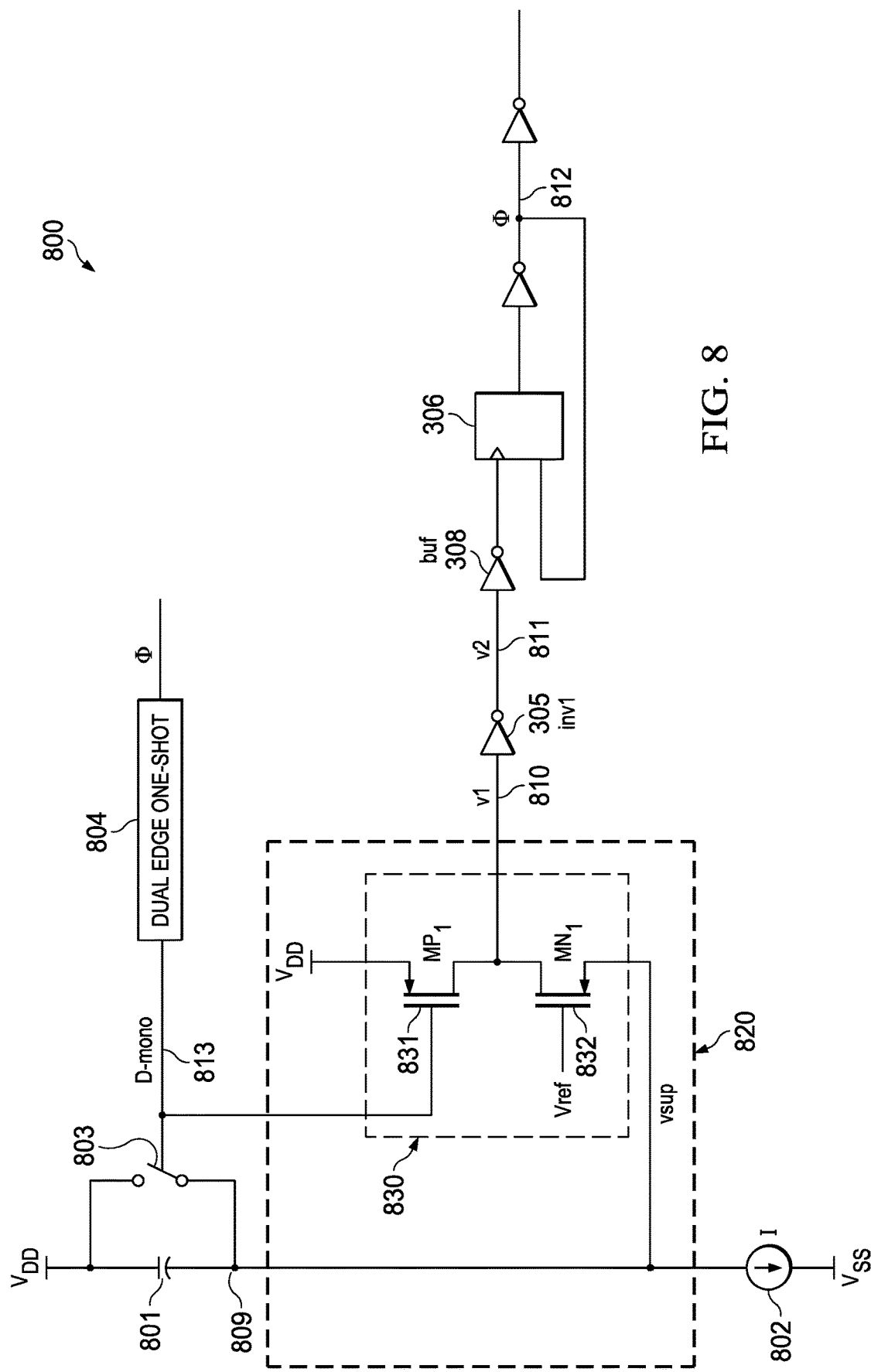
FIG. 8 is a schematic of another comb waveform generator that may be used in FIG. 3.
Figure 9:
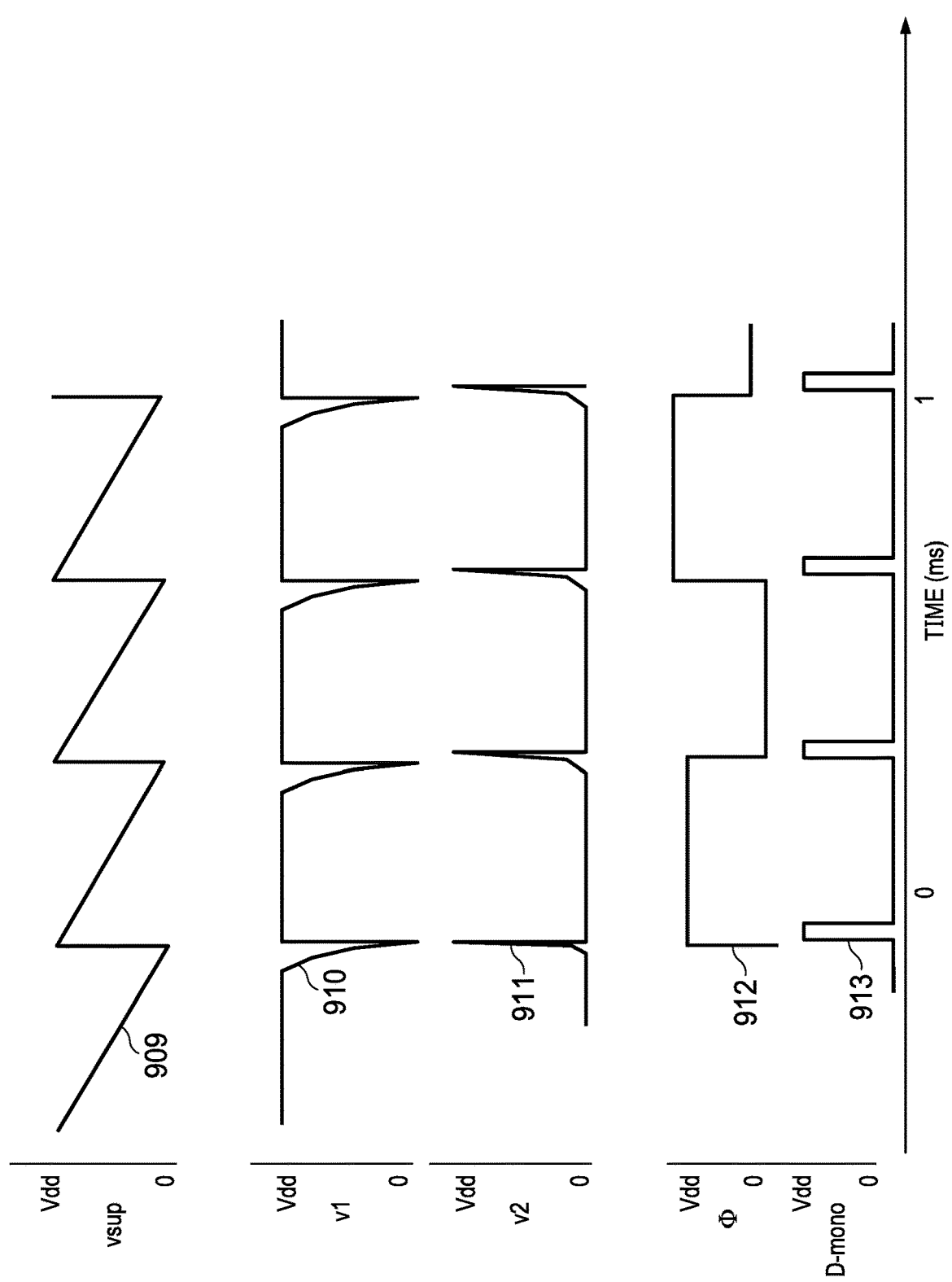
FIG. 9 is a set of voltage plots illustrating operation of the kHz oscillator of FIG. 8.

FIG. 8 is a schematic of another comb waveform generator 820 that may be used in FIG. 3. FIG. 9 is a set of voltage plots illustrating operation of kHz oscillator 800 of FIG. 8. This example uses a current sink 802 to charge capacitor 801, such that sawtooth supply voltage vsup on signal line 809 ramps down as shown in plot 909 of FIG. 9. Switch device 803 then discharges capacitor 801 in response to control signal "D-mono" generated on signal line 813 by one-shot circuit 804, in a similar manner to operation of oscillator 300 of FIG. 3. Signal D-mono on signal line 813 is illustrated by plot 913 in FIG. 9. Signal Φ on signal line 812 is illustrated by plot 912 in FIG. 9. In this example, negative comb spikes are formed on signal line 810 as shown by plot 910 of FIG. 9. Positive comb spikes are formed on signal line 811 as shown by plot 911 of FIG. 9.

In this example, comb waveform generator 820 includes a PMOS transistor 831 and an NMOS transistor 832, which are connected in series to implement inverter 830, for example. Inverter 830 may be similar to inverter 530 of FIG. 5, except that a gate input for PMOS transistor 831 is connected to receive the one-shot signal D-mono on signal line 813, while a gate input for NMOS transistor 832 is connected to a reference voltage "Vref". While signal D-mono on signal line 813 is low, PMOS transistor 831 is turned on and pulls up output signal v1 on signal line 810. This may cause a brief short circuit current through transistor 832, but the duration of the D-mono pulse width is very small compared to the clock period (i.e. 50 nS vs 500 us), so the impact is very minimal to overall average Iq. In this example, vsup on signal line 809 must fall below reference voltage Vref before NMOS transistor 832 turns on to pull down output 810. In this manner, reference voltage Vref sets a peak voltage height of comb waveform v1 on signal line 810. As Vref becomes lower, the peak of signal v1 becomes higher on signal line 810.

Figure 11:
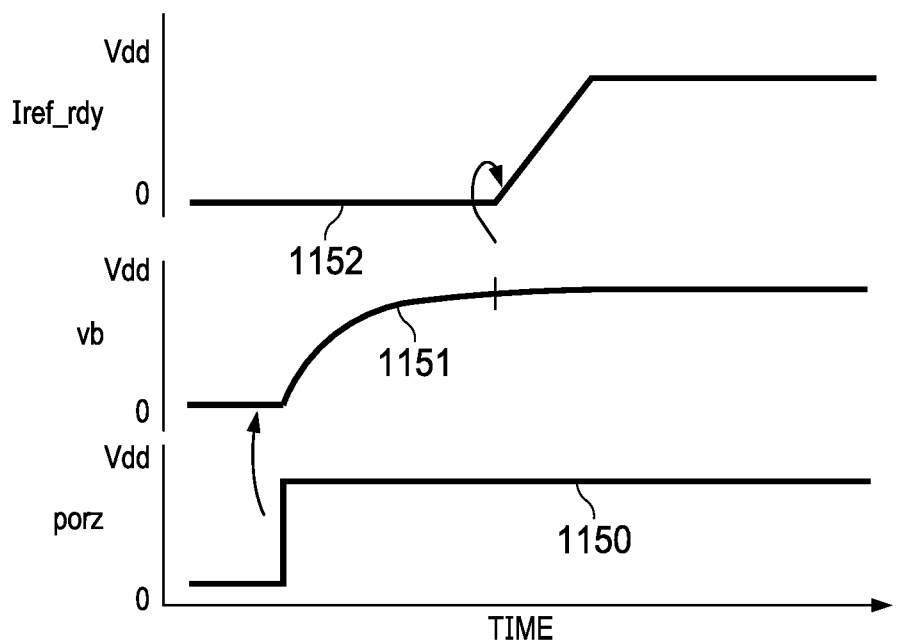
FIG. 11 is a set of plots illustrating operation of the duty cycled bias generator of FIG. 10.
Figure 10:
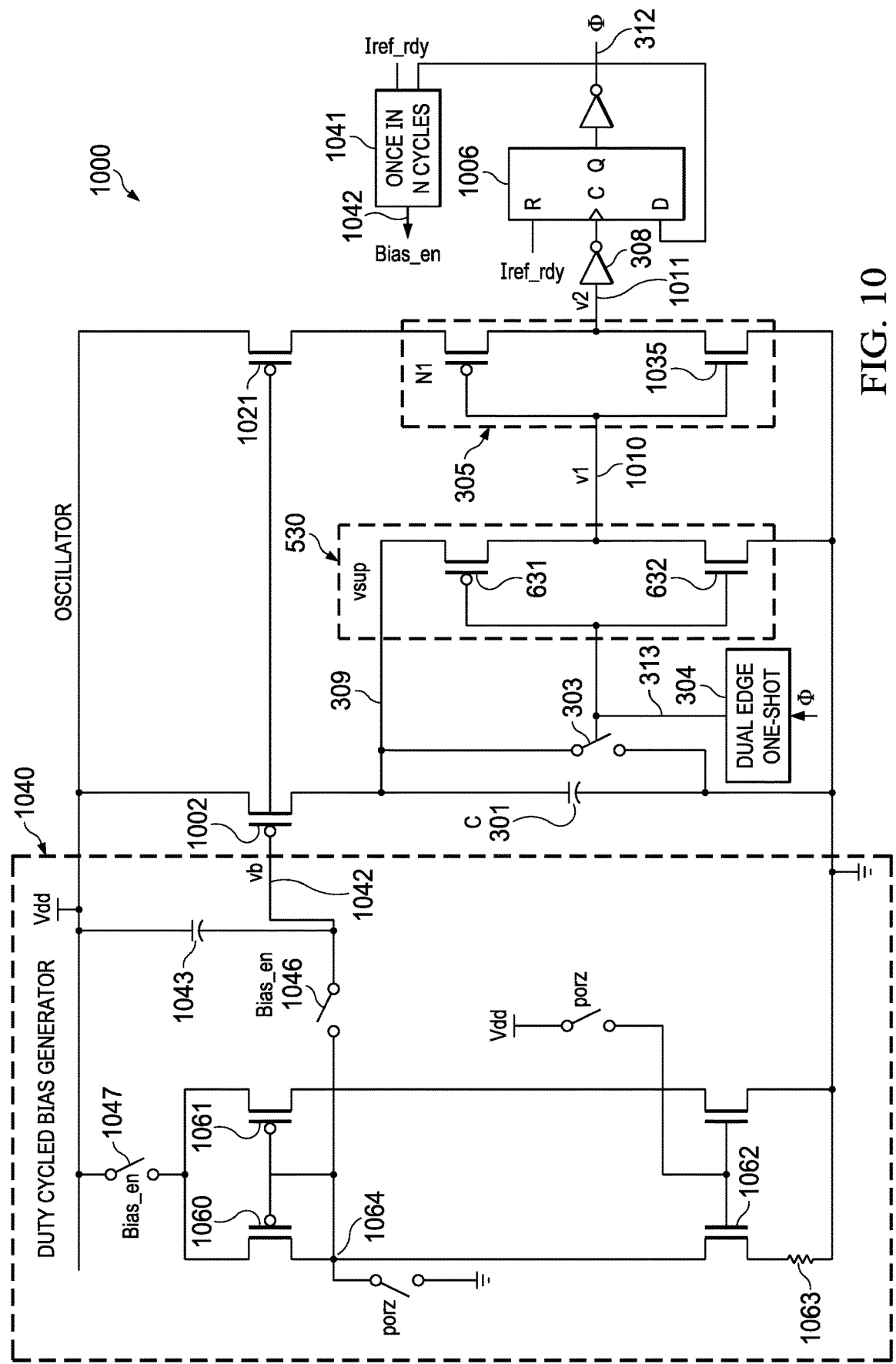
FIG. 10 is a schematic of a kHz oscillator that includes a duty cycled bias generator.
Figure 12:
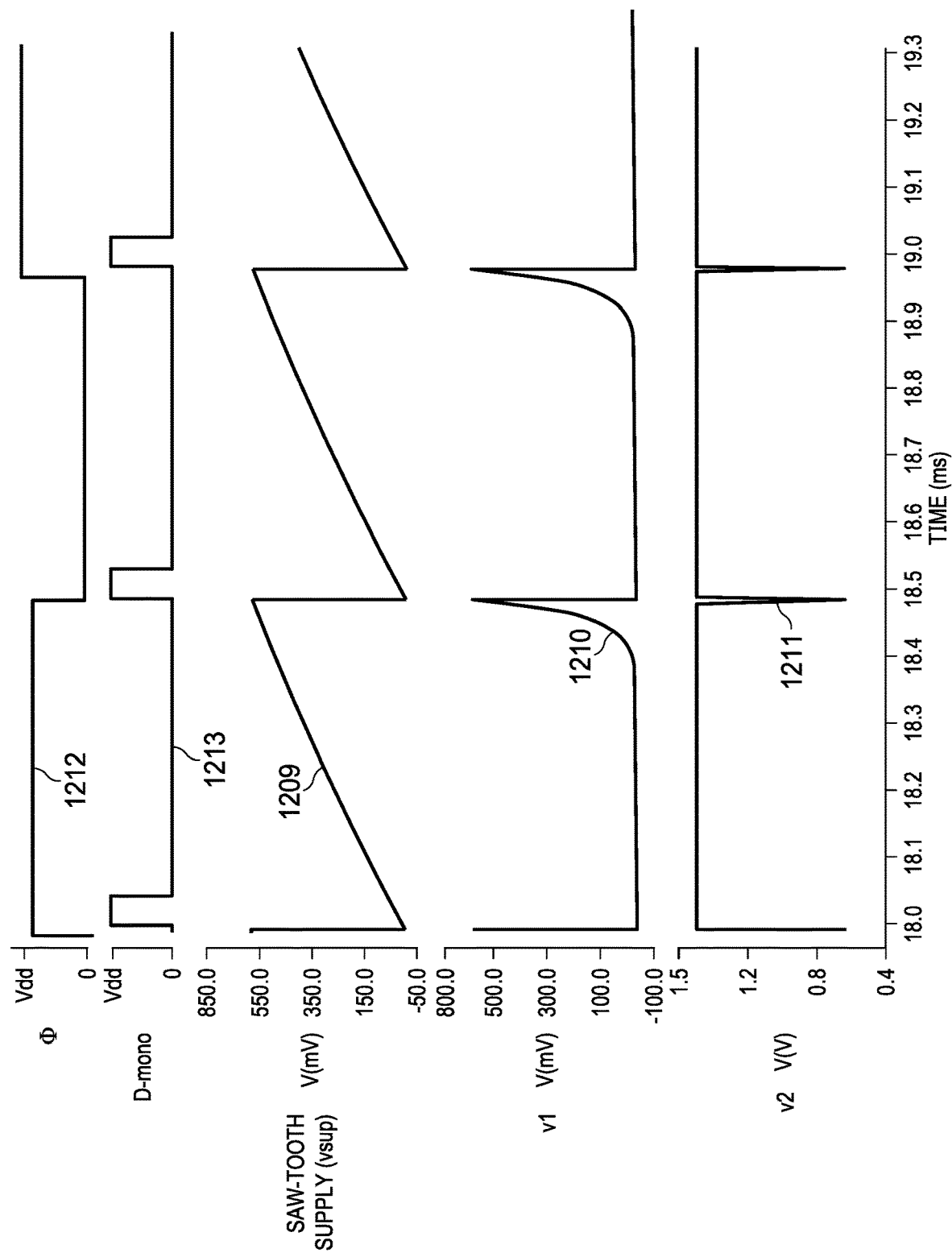
FIG. 12 is a set of waveforms that illustrate operation of the oscillator of FIG. 10

FIG. 10 is a schematic of a kHz oscillator 1000 that includes a duty cycled bias generator 1040. FIG. 11 is a set of plots illustrating operation of the duty cycled bias generator of FIG. 10. FIG. 12 is a set of waveforms that illustrate operation of the oscillator of FIG. 10. In this example, oscillator 1000 is similar to oscillator 300 of FIG. 6, and it generates a square wave clock signal Φ on signal line 312, as illustrated by plot 1212 of FIG. 12.

Bias generator 1040 generates a bias voltage (vb) that is coupled to the gate of PMOS transistor 1002 to form a current source to provide charging current to capacitor 301. One-shot circuit 304 generates a pulse on signal line 313 (as shown in plot 1213 of FIG. 12), which controls switch element 303. A sawtooth waveform is thereby formed on signal line 309, which provides power to comb waveform generator inverter 530 (FIG. 5), as illustrated by plot 1209 of FIG. 12.

Initially, bias generator 1040 is reset by active low power on reset (porz) signal, as illustrated by plot 1150 in FIG. 11. The reset signal may be used to control a number of switches (coupled to various nodes within bias generator 1040) to set or clear the nodes to initial states. After signal porz is deasserted (has a high logic level), bias generator 1040 begins to operate. A current flow through transistor 1060, 1062 and resistor 1063 forms a voltage divider at node 1064. A bias voltage (vb) builds up across capacitor 1043, which is coupled to node 1064, as illustrated by plot 1151 of FIG. 11. A delayed "reference ready" signal (Iref_rdy) is asserted by charging a capacitor (not shown) to indicate that the bias generator is operating and that bias signal vb is stable, as indicated by plot 1152 in FIG. 11.

A counter 1041 is coupled to receive clock signal Φ on signal line 312 and configured to output a bias enable (bias_en) pulse on signal line 1042 every N cycles of clock signal Φ. This example has a counter, but other examples may have different examples of known or later developed delay circuits to generate a periodic pulse. The bias enable signal may be used to control several switches with bias generator 1040, such as switch 1046 and 1047. Switches 1046, 1047 may be configured to be conductive only during the time a pulse is active on bias enable signal on signal line 1042. When the switches 1046, 1047 are in a non-conductive state, then current flow through transistors 1060, 1061 and 1062 is blocked, and thereby power dissipation by bias generator 1040 is minimized. During each time period in which no current is flowing through transistor 1060, 1062, 1062, capacitor 1043 maintains the bias voltage at an approximately steady value. Initially, counter 1041 is disabled, and the bias enable signal on line 1042 remains active until the reference ready signal is asserted.

Oscillator 1000 operates at a frequency that is determined by the capacitance of capacitor C, the magnitude of current (I) that is provided by current source 1002, and the threshold voltage of NMOS transistor 1035 (VtN1) that forms inverter 305, as shown by expression (1).

$$F = \frac{I}{C \times VtN1} \qquad (1)$$

As described in more detail hereinabove, comb waveform generator 530 generates a fast-rising pulse v1 on signal line 1010, as shown by plot 1210 in FIG. 12. In this example, bias voltage vb is also coupled to the gate of PMOS transistor 1021 to form a current source that provides power to inverter 305, causing inverter 305 to operate in a current starved mode as described with regard to FIGS. 3-6. Negative pulse signal v2 is generated by inverter 305 on signal line 1011 in response to comb waveform v1, as illustrated by plot 1211 in FIG. 12.

Figure 13:
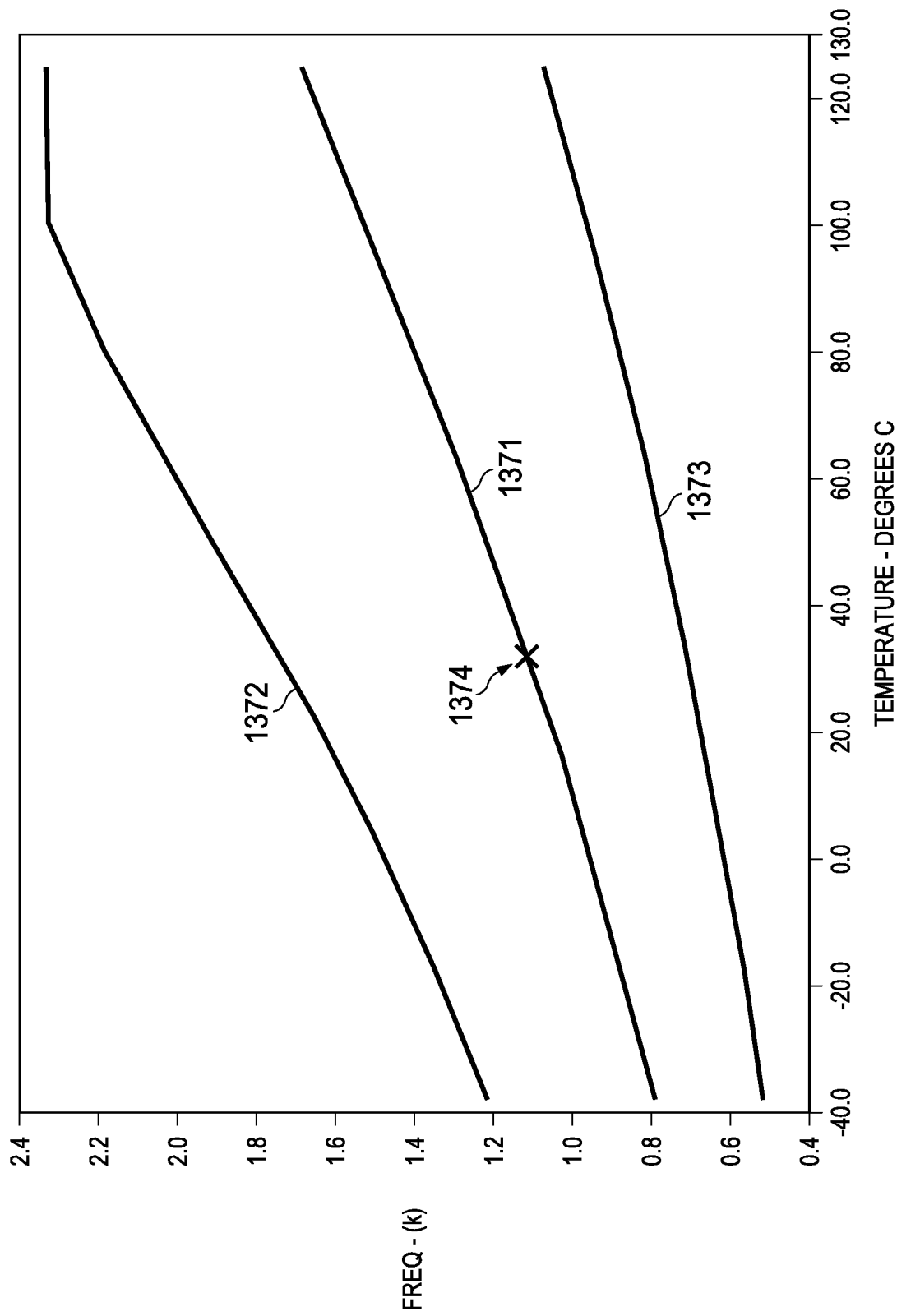
FIG. 13 is a set of plots illustrating frequency of operation of the kHz oscillator of FIG. 10 over a range of parameters.

Referring to FIG. 12, the period of clock signal Φ is approximately 1.0 ms, with a frequency of approximately 1 kHz. FIG. 13 is a set of plots illustrating frequency of operation of the kHz oscillator of FIG. 10 over a range of parameters. Plot line 1371 represents nominal process parameters, while plot line 1372 represents strong process parameters, and plot line 1373 represents weak process parameters. In this example, at a nominal temperature of 30 C, the oscillator operates at 1 kHz. However, a fairly wide range of oscillator frequency may occur over a range of temperature and process parameters. As described hereinabove, some applications for low power systems may not be sensitive to variations such as described herein.

Figure 14:
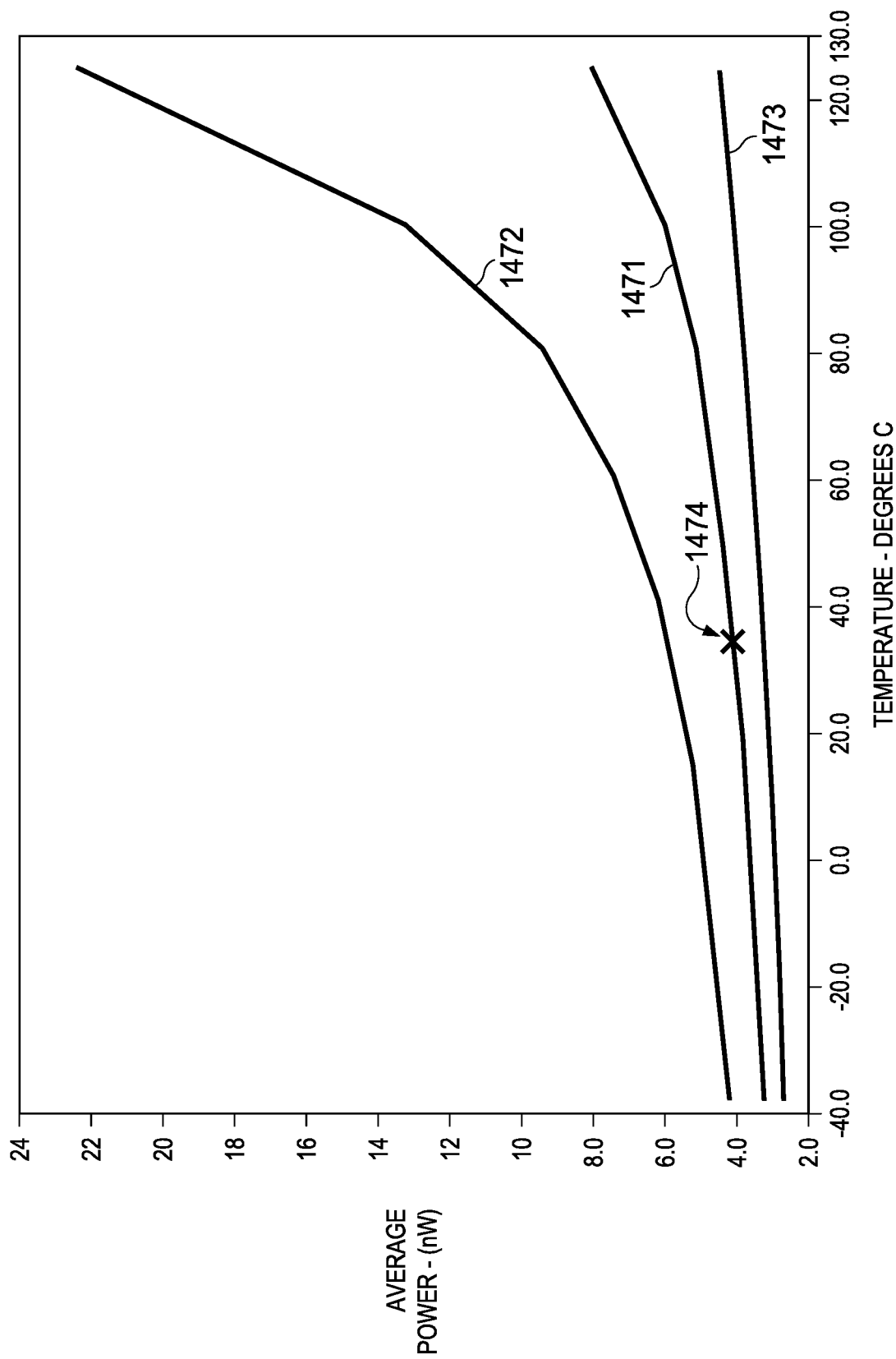
FIG. 14 is a set of plots illustrating power consumption of the kHz oscillator of FIG. 10 over a range of parameters.

FIG. 14 is a set of plots illustrating power consumption of the kHz oscillator of FIG. 10 over a range of parameters. Plot line 1471 represents nominal process parameters, while plot line 1472 represents strong process parameters, and plot line 1473 represents weak process parameters. In this example, at a nominal temperature of 30 C and at an operating voltage of 1.4V, the oscillator dissipates approximately 3.8 nW at an average current of 2.7 nA.

Figure 15:
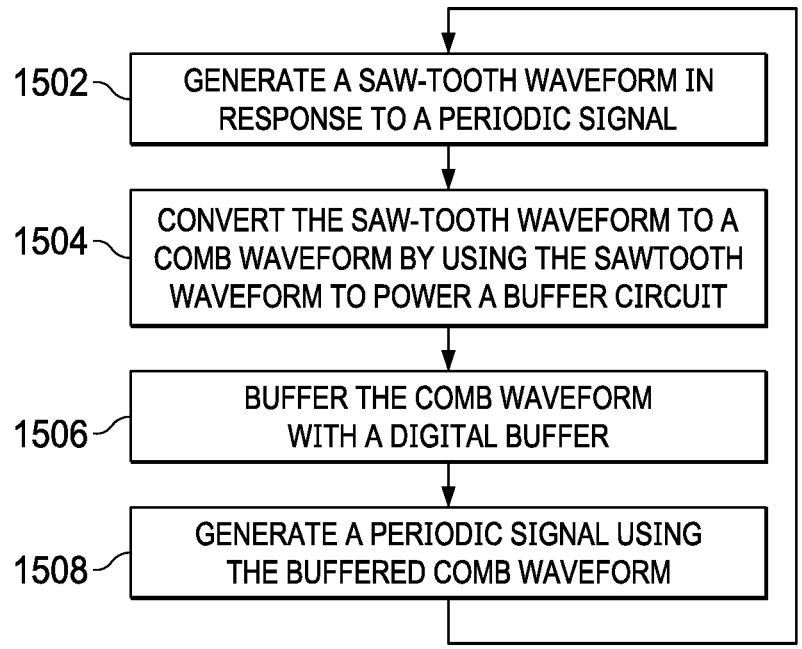
FIG. 15 is a flow diagram illustrating operation of the kHz oscillators of FIGS. 3, 7, 8 and 10.

FIG. 15 is a flow diagram illustrating operation of the kHz oscillators of FIGS. 3, 7, 8 and 10. As further described hereinabove, the oscillators of FIGS. 3, 7 and 8 are relaxation oscillators in which a capacitive or inductive element is repetitively charged and discharged under control of a switching device. The period of the oscillator depends on the time constant of the capacitor or inductor circuit. The switching device switches abruptly between charging and discharging modes, and thus generates a discontinuously changing repetitive waveform, which may be referred to as a sawtooth waveform. At 1502, a sawtooth waveform is generated by using a square wave generated by the oscillator that is fed back to control the switching device.

At 1504, a comb waveform generator converts the sawtooth waveform to a comb waveform that includes periodic pulses. The sawtooth waveform has a relatively slow rise time, but each pulse of the comb waveform has a relatively fast rise and fall time. A comb waveform generator may be implemented using a two transistor inverter circuit that is powered by the sawtooth waveform. A pulse signal may be received as an input by the inverter. When the pulse signal and the sawtooth waveform reach a sufficient magnitude, an output of the inverter will rapidly transition to form each pulse of the comb waveform. The pulse signal may be the same signal that controls the switching device for the sawtooth waveform generator.

At 1506, a digital buffer converts the comb waveform to a digital signal. As described with regard to FIG. 3, a short circuit current may be produced in the output stage of the digital buffer if the input signal has a slow transition. Therefore, short circuit current is significantly reduced by providing the comb waveform to the digital buffer.

At 1508, a square wave is generated in response to the comb waveform. As further described hereinabove, a flip-flop may be used to toggle between two logic levels when clocked by the comb waveform. The resulting square waveform may then be used to control the switching device for the sawtooth waveform generator. For example, a one-shot timing circuit may be triggered on each rise, or alternatively on each fall, of the square waveform. The one-shot circuit may be configured to generate a short pulse each time it is triggered. The short pulse may be used to control the switching device and may be received as an input by the comb waveform generator buffer circuit.

System Example

Figure 16:
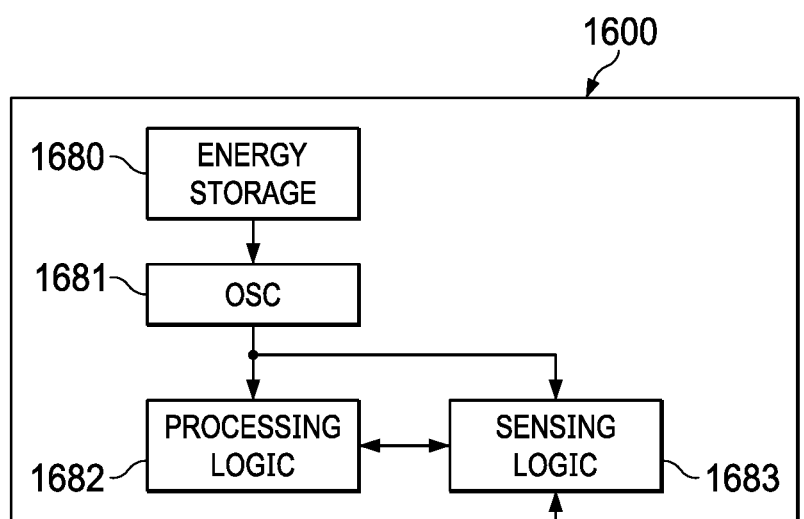
FIG. 16 is a block diagram of an example system that includes a low power oscillator.

FIG. 16 is a block diagram of an example system 1600 that includes a low power oscillator 1681 as described herein. Low frequency oscillator 1681 may be similar to oscillator 1000 of FIG. 10, for example. Oscillator 1681 may be coupled to processing logic 1682 to provide a clock signal for use by processing logic 1682. Processing logic 1682 may be any known or later developed processing logic that requires a low frequency clock signal for operation. Similarly, oscillator 1681 may be coupled to sensing logic 1683 for use by sensing logic 1683. Sensing logic 1683 may be any of a variety of known or later developed circuits or interfaces that may be used to sense external conditions, parameters, signals, etc. Processing logic 1682 may be coupled to sensing logic 1683 and control the operation of sensing logic 1683. Also, system 1600 may include additional interface logic and storage circuitry.

Energy storage 1680 provides energy to oscillator 1681 and to the other circuitry within system 1600. Energy storage 1680 device may be a battery in some examples. In other examples, energy storage 1680 may be a capacitor or inductor that is charged by energy scavenging from the surrounding environment, such as by near field coupling, light energy, thermal energy, vibration energy, etc. Low power operation of oscillator 1681 conserves power available for energy storage 1680.

System 1600 may be fabricated on an integrated circuit (IC) die using known or later developed fabrication techniques and may be packaged as an IC package using known or later developed packaging techniques.

Other Examples

In described examples, a low power oscillator operates with a frequency of approximately 1 kHz. In other examples, the operating frequency may be higher or lower. For example, another low power oscillator may operate at a frequency of approximately 10 kHz.

Various configurations of inverting buffers are described herein. In other examples, non-inverting buffers may be used.

In described examples, a flip-flop logic module generates the square wave signal. In another example, an alternative type of state machine may be used to generate a square wave.

In another example, a square wave with other than a 50/50 on/off cycle may be implemented.

In described examples, a comb waveform generator is coupled to a relaxation oscillator. In another example, a comb waveform generator (as described herein) may be coupled another type of digital circuit, which may benefit from fast rise time signals to reduce short circuit current within digital logic.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described examples, and other examples are possible, within the scope of the claims.

What is claimed is:

1. An integrated circuit (IC) comprising:
a sawtooth waveform generator having a generator output, the sawtooth waveform generator configured to generate a sawtooth waveform at the generator output, the sawtooth waveform having a first rise time; and
a comb waveform circuit having a power input and a circuit output, the power input coupled to the generator output, and the comb waveform circuit configured to generate a comb waveform at the circuit output responsive to the sawtooth waveform, the comb waveform having a second rise time faster than the first rise time;
in which the comb waveform circuit includes:
a p-type field effect transistor (PFET) having a first drain, a first source and a first gate, the first source coupled to the power input, and the first drain coupled to the circuit output; and
an n-type field effect transistor (NFET) having a second drain, a second source and a second gate, the second source adapted to be coupled to a supply voltage, and the second drain coupled to the first drain.

2. The IC of claim 1, wherein the sawtooth waveform generator has a generator input, the comb waveform circuit has a circuit input, the generator output is a first generator output, the IC further comprises a pulse waveform generator having a second generator output, the pulse waveform generator is configured to generate a periodic pulse waveform at the second generator output, the generator input is coupled to the second generator output, and the circuit input is coupled to the second generator output.

3. The IC of claim 2, wherein the first and second gates are coupled to the circuit input.

4. The IC of claim 2, wherein one of the first and second gates is coupled to the circuit input, and a different one of the first and second gates is adapted to be coupled to a reference voltage.

5. The IC of claim 1, wherein the IC further comprises:
a buffer having a buffer input and a buffer output, the buffer input coupled to the circuit output;
a flip-flop having a clock input and a flip-flop output, the clock input coupled to the buffer output, and the flip-flop configured to toggle the flip-flop output responsive to the clock input; and
feedback logic coupled between the flip-flop output and the sawtooth waveform generator.

6. The IC of claim 5, wherein the buffer includes serially connected inverters, and at least one of the serially connected inverters has a power terminal adapted to be coupled to a current source.

7. An oscillator circuit comprising:
a sawtooth waveform generator having a first generator output, the sawtooth waveform generator configured to generate a sawtooth voltage signal at the first generator output;
a comb waveform generator having a power input and a second generator output, the power input coupled to the first generator output;
a buffer having a buffer input and a buffer output, the buffer input coupled to the second generator output;
a flip-flop having a clock input and a flip-flop output, the clock input coupled to the buffer output, and the flip-flop configured to toggle the flip-flop output responsive to the clock input; and
feedback logic coupled between the flip-flop output and the sawtooth waveform generator.

8. The oscillator circuit of claim 7, wherein the comb waveform generator includes an inverter having a power terminal, an inverter input and an inverter output, in which the power terminal is coupled to the power input, and the inverter output is coupled to the second generator output.

9. The oscillator circuit of claim 8, wherein the inverter includes:
a p-type field effect transistor (PFET) having a first drain, a first source and a first gate, the first source coupled to the power terminal, and the first drain coupled to the inverter output; and
an n-type field effect transistor (NFET) having a second drain, a second source and a second gate, the second source adapted to be coupled to a supply voltage, and the second drain coupled to the first drain.

10. The oscillator circuit of claim 9, wherein the sawtooth waveform generator has a first generator input, the comb waveform generator has a second generator input, the IC further comprises a pulse waveform generator having a third generator output, the pulse waveform generator is configured to generate a periodic pulse waveform at the third generator output, the first generator input is coupled to the third generator output, and the second generator input is coupled to the third generator output.

11. The oscillator circuit of claim 10, wherein the first and second gates are coupled to the second generator input.

12. The oscillator circuit of claim 10, wherein one of the first and second gates is coupled to the second generator input, and a different one of the first and second gates is adapted to be coupled to a reference voltage.

13. The oscillator circuit of claim 7, wherein the buffer includes serially connected inverters.

14. The oscillator circuit of claim 13, wherein at least one of the serially connected inverters has a power terminal adapted to be coupled to a current source.

15. A method of operating a circuit, the method comprising:
generating a sawtooth waveform having a first rise time responsive to a periodic signal; and
converting the sawtooth waveform to a comb waveform having a second rise time faster than the first rise time, by using the sawtooth waveform to power a buffer circuit using current from the sawtooth waveform;
in which converting the sawtooth waveform to the comb waveform includes receiving the sawtooth waveform at a source of a transistor of the buffer circuit, receiving a reference voltage at a gate of the transistor, and generating the comb waveform at a drain of the transistor.

16. The method of claim 15, wherein the transistor is a first transistor, the method further comprises receiving a pulse signal at a gate of a second transistor of the buffer circuit, a drain of the second transistor is connected to the drain of the first transistor, and a source of the second transistor is adapted to be coupled to a supply voltage.

* * * * *